United States Patent [19]

Ishihara et al.

[11] Patent Number: 5,470,389
[45] Date of Patent: Nov. 28, 1995

[54] APPARATUS FOR FORMING DEPOSITED FILM

[75] Inventors: Shunichi Ishihara, Ebina; Junichi Hanna; Isamu Shimizu, both of Yokohama; Masaaki Hirooka, Toride, all of Japan

[73] Assignee: Canon Kabushiki Kaisha, Tokyo, Japan

[21] Appl. No.: 212,930

[22] Filed: Mar. 15, 1994

Related U.S. Application Data

[62] Division of Ser. No. 999,548, Dec. 31, 1992, Pat. No. 5,322,568, which is a continuation of Ser. No. 875,193, Apr. 16, 1992, abandoned, which is a continuation of Ser. No. 744,819, Aug. 12, 1991, abandoned, which is a continuation of Ser. No. 426,530, Oct. 24, 1989, abandoned, which is a continuation of Ser. No. 945,814, Dec. 24, 1986, abandoned.

[30] Foreign Application Priority Data

Dec. 28, 1985 [JP] Japan .................................. 60-298041
Jan. 15, 1986 [JP] Japan ...................................... 61-5951

[51] Int. Cl.$^6$ .................................................. C23C 16/00
[52] U.S. Cl. ...................... 118/719; 118/715; 118/725; 118/730
[58] Field of Search .................... 118/715, 725, 118/719, 730

[56] References Cited

FOREIGN PATENT DOCUMENTS 2148328  5/1985  United Kingdom .

Primary Examiner—Richard Bueker
Attorney, Agent, or Firm—Fitzpatrick, Cella, Harper & Scinto

[57] ABSTRACT

An apparatus for forming a deposited film by introducing two or more kinds of gaseous starting materials for formation of a deposited film and a gaseous halogenic oxidizing agent having the property of oxidation action for said starting materials into a reaction space to effect chemical contact therebetween to thereby form a plural number of precursors including precursors under excited state, and forming a deposited film in a plurality of layers with different compositions on a substrate existing in a film forming space spatially communicated with said reaction space with the use of at least one precursor of the precursors as the feeding source for the constituent element of the deposited film, said apparatus comprising a plural number of gas introducing means of a multiple tubular structure for discharging into said reaction space said gaseous starting materials and said gaseous halogenic oxidizing agent through the discharging outlets, respectively, and permitting them to react with each other to form the precursors and means for preventing contact of precursors unnecessary for the desired film formation of the precursors with the substrate.

8 Claims, 4 Drawing Sheets

APPARATUS FOR FORMING DEPOSITED FILM

This application is a division of application Ser. No. 07/999,548 filed Dec. 31, 1992, now U.S. Pat. No. 5,322, 568, which is a continuation of application Ser. No. 07/875, 193 filed Apr. 16, 1992, abandoned, which is a continuation of application Ser. No. 07/744,819, filed Aug. 12, 1991, abandoned, which is a continuation of application Ser. No. 426,530 filed Oct. 24, 1989, abandoned, which is a continuation of application Ser. No. 06/945,814 filed Dec. 24, 1986, abandoned.

BACKGROUND OF THE INVENTION

1. Field of the Invention

This invention relates to an apparatus for formation of a functional film, especially a functional deposited film which is useful for uses in electronic devices such as semiconductor devices, photosensitive devices for electrophotography, optical input sensor devices for optical image inputting devices, etc., particularly suitable for formation of a multi-layer structure film.

2. Related Background Art

Amorphous or polycrystalline functional multi-layer structure films such as semiconductor films, insulating films, photoconductive films, magnetic films or metal films, are formed by laminating a large number of layers with thicknesses of, for example, from some ten to some hundred angstroms, and from the viewpoint of various desirable physical characteristics not desired for films of single layer structure and uses, they have been studied aggressively in recent years. Particularly, from the standpoint of application for large area devices, multi-layer structrue films comprising two or more kinds of amorphous layers with different physical properties laminated successively are attracting interest.

For example, a multi-layer structure film of amorphous silicon (a-Si) layer and amorphous silicon carbide (a-SiC) layer or a multi-layer structure film of amorphous silicon layer and amorphous silicon germanium (a-SiGe) layer is prepared by the plasma glow discharging method, or the optical CVD method, and is contemplated to be applied for solar battery or other devices.

However, the reaction process in formation of a silicon-based deposited film according to the plasma CVD method which has been generalized in the prior art is considerably complicated as compared with the CVD method of the prior art, and its reaction mechanism involves not a few ambiguous points. Also, there are a large number of parameters for formation of a deposited film (for example, substrate temperature, flow rate and flow rate ratio of the introduced gases, pressure during formation, high frequency power, electrode structure, structure of the reaction vessel, speed of evacuation, plasma generating system, etc.). By use of a combination of such a large number of parameters, the plasma may sometimes become unstable state, whereby marked deleterious influences were exerted frequently on the deposited film formed. Besides, the parameters characteristic of the apparatus must be selected for each apparatus and therefore under the present situation it has been difficult to generalize the production conditions.

On the other hand, for the silicon-based deposited film to exhibit sufficiently satisfactory electric and optical characteristics for respective uses, it is now accepted the best to form it according to the plasma CVD method.

However, depending on the application use of the silicon-based deposited film, bulk production with reproducibility must be attempted with full satisfaction of enlargement of area, uniformity of film thickness as well as uniformity of film quality, and therefore in formation of a silicon-based deposited film according to the plasma CVD method, enormous installation investment is required for a bulk production apparatus and also management items for such bulk production become complicated, with a width of management tolerance being narrow and the control of the apparatus being severe. These are pointed as the problems to be improved in the future.

Also, in the case of the plasma CVD method, since plasma is directly generated by high frequency or microwave, etc., in the film forming space in which a substrate on which film is formed is arranged, electrons or a number of ion species generated may give damages to the film in the film forming process to cause lowering in film quality or non-uniformization of film quality.

Particularly, for formation of a multi-layer structure film according to the plasma CVD method, on-off of gases and also on-off of discharging, if necessary, must be practiced every time when the layer is changed.

By practicing on-off gases, the pressure within the reaction chamber is changed to make the discharging state different. For this reason, according to the method in which a multi-layer structure film is formed only by on-off of gases with discharging being kept on, it is difficult to form a film under the conditions so that good characteristics of the film may be constantly obtained. Also, if discharging is not turned off, even if the gas introduction may be turned off, due to the presence of residual gas, it is difficult to form a multi-layer structure film with an abrupt change in the layer structure. On the contrary, when film formation is effected with discharging being turned on after gases are exchanged with discharging being turned off and the pressure within the reaction chamber has reached a desired equilibrium state, a multi-layer film with an abrupt change in layer structure can be obtained. However, according to this method, it will take an extremely long time to form a film, whereby productivity is relatively lower. Also, in plasma discharging, discharging is not stabilized ordinarily immediately after discharging is turned on and therefore characteristics at the layer interface are liable to be deteriorated.

As contrasted to the plasma CVD method, the optical CVD method is advantageous in that no ion species or electrons are generated which give damages to the film quality during film formation. However, there are problems such that the light source is limited in kind, that the wavelength of the light source tends to be toward UV-ray side, that a large scale light source and its power source are required in the case of industrialization, that the window for permitting the light from the light source to be introduced into the film forming space is coated with a film during film formation to result in lowering in dose during film formation, which may further lead to shut-down of the light from the light source into the film forming space.

As described above, in formation of silicon-based deposited film, particularly multi-layer structure films, the points to be solved still remain, and it has been earnestly desired to develop an apparatus for forming a deposited film which is capable of bulk production by attempting to effect conservation of energy by means of an apparatus of low cost, while maintaining the characteristics as well as uniformity which are practically available.

SUMMARY OF THE INVENTION

An object of the present invention is to remove the drawbacks of the apparatus for forming multi-layer deposited films as described above and at the same time to provide a novel apparatus for forming a deposited film for obtaining a multi-layer structure film without use of the formation method of the prior art.

Another object of the present invention is to provide an apparatus for forming a deposited film by which deposited films including multi-layer structure films with uniform characteristics over a large area can be obtained with easy management of film quality while effecting energy saving.

Still another object of the present invention is to provide an apparatus for forming a deposited film capable of obtaining a multi-layer structure film, by which a film excellent in productivity and bulk productivity, having high quality as well as excellent physical characteristics such as electrical, optical and semiconductor characteristics can be easily obtained.

According to the present invention, there is provided on apparatus for forming a deposited film by introducing two or more kinds of gaseous starting materials for formation of a deposited film and a gaseous halogenic oxidizing agent having the property of oxidation action for said starting materials into a reaction space to effect chemical contact therebetween to thereby form a plural number of precursors including precursors under excited state, and forming a deposited film in a plurality of layers with different compositions on a substrate existing in a film forming space spatially communicated with said reaction space with the use of at least one precursor of the precursors as the feeding source for the constituent element of the deposited film, said apparatus comprising a plural number of gas introducing means of a multiple tubular structure for discharging into said reaction space said gaseous starting materials and said gaseous halogenic oxidizing agent through the gas discharging outlets, respectively, and permitting them to react with each other to form the precursors and means for preventing contact of precursors unnecessary for the film formation of the precursors onto the substrate.

DESCRIPTION OF THE PREFERRED EMBODIMENTS

Figure 1:
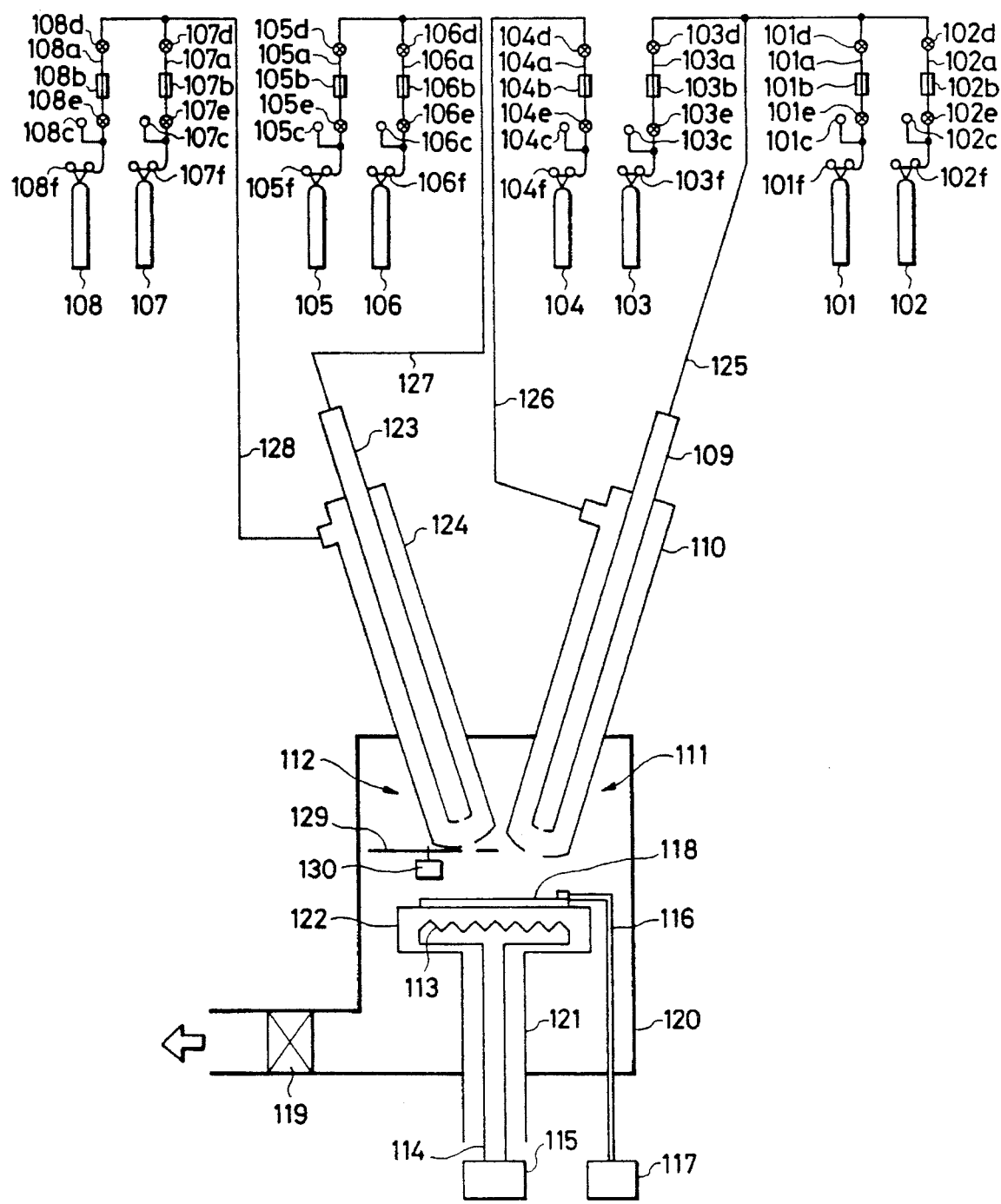
FIG. 1 and FIG. 2 illustrate schematically the apparatuses for forming deposited film according to the first and the second embodiments of the present invention.

The apparatus for forming a deposited film of present invention which can accomplish the above object is an apparatus for forming a deposited film by introducing two or more kinds of gaseous starting materials for formation of a deposited film and a gaseous halogenic oxidizing agent having the property of oxidation action for said starting materials into a reaction space to effect chemical contact therebetween to thereby form a plural number of precursors including precursors under excited state, and forming a deposited film in a plurality of layers with different compositions on a substrate existing in a film forming space spatially communicated with said reaction space with the use of at least one precursor of the precursors as the feeding source for the constituent element of the deposited film, said apparatus comprising a plural number of gas introducing means of a multiple tubular structure for discharging into said reaction space said gaseous starting materials and said gaseous halogenic oxidizing agent through the discharging outlets, respectively, and permitting them to react with each other to form the precursors and means, for preventing contact of precursors unnecessary for the desired film formation of the precursors onto the substrate.

By use of the apparatus for forming a deposited film of the present invention as specified above, simplification of management and bulk production can be effected with full satisfaction of enlargement of area, uniformity of film thickness and uniformity of film quality simultaneously with conservation of energy, without requiring enormous installation investment for bulk production apparatus, and also the management items for its bulk production become clear to afford broad management tolerance and simple control of the apparatus.

The gaseous starting material to be used for formation of a deposited film to be used in the apparatus for forming a deposited film of the present invention receives oxidizing action through chemical contact with a gaseous halogenic oxidizing agent and can be selected suitably as desired depending on the kind, the characteristic, use, etc., of the desired deposited film. In the present invention, the gaseous starting material and the gaseous halogenic oxidizing agent may be those which can be made gaseous in chemical contact, and they may be either liquid or solid as ordinary state.

When the starting material for formation of a deposited film or a halogenic oxidizing agent is liquid or solid, the starting material for formation of a deposited film and the halogenic oxidizing agent can be introduced in gaseous state into the reaction space while performing bubbling with the use of carrier gas such as Ar, He, $N_2$, $H_2$, etc., optionally with application of heat.

During this operation, the partial pressures and mixing ratio of the above gaseous starting material and the gaseous halogenic oxidizing agent may be set by controlling the flow rate of the carrier gas and the vapor pressures of the starting material for formation of the deposited film and the gaseous halogenic oxidizing agent.

As the starting material for formation of deposited film to be used in the present invention, for example, if tetrahedral type deposited films such as semiconductive or electrically insulating silicon deposited films or germanium deposited films, etc., are desired to be obtained, straight chain and branched chain silane compounds, cyclic silane compounds, chain germanium compounds, etc., may be employed as effective ones.

Specifically, examples of straight chain silane compounds may include $Si_nH_{2n+2}$ (n=1,2,3,4,5,6,7,8), examples of branched chain silane compounds include $SiH_3SiH(SiH_3)SiH_2SiH_3$, and examples of chain germanium compounds include $Ge_mH_{2m+2}$ (m=1,2,3,4,5), etc. Otherwise, for example, if deposited films of tin are desired to be prepared, hydrogenated tin such as $SnH_4$, etc., may be employed as effective starting material.

Of course, these starting materials may be used either as a single kind or as a mixture of two or more kinds.

The halogenic oxidizing agent to be used in the present invention is made gaseous when introduced into the reaction space and at the same time has the property of effectively oxidizing the gaseous starting material for formation of a deposited film introduced into the reaction space by mere-chemical contact therewith, including halogenic gas such as $F_2$, $Cl_2$, $Br_2$, $I_2$, FCl, FBr, etc., and fluorine, chlorine, bromine, etc., under nascent state as effective ones.

These halogenic oxidizing agents are introduced into the reaction space under gaseous state together with the gas of the starting material for formation of a deposited film as described above with desired flow rate and feeding pressure given, wherein they are mixed with and collided against the above starting material to be chemically contacted therewith, thereby oxidizing the above starting material to generate efficiently a plural kinds of prucursors containing precursous under excited state. Of the precursors under excited state and other precursors generated, at least one of them function as the feeding source for the constitutent element of the deposited film formed.

The precursors generated may undergo decomposition or reaction to be converted to other precursors under excited state or to precursors under another excited state, or alternatively in their original forms, if desired, although releasing energy to contact the substrate surface arranged in a film forming space, whereby a deposited film with a three-demensional network structure is prepared.

The energy level to which the precursors are exicited is preferred to be an energy level such that luminescence is observed in the process in which the precursor in the above excited state is subjected to energy transition to a lower energy level, or alternatively in the process in which it is changed to another chemical species. By formation of an activated precursor including the precursor under excited state accompanied with luminescence in such a transition of energy, the deposited film forming process in the apparatus of the present invention proceeds with better efficiency and more conservation of energy to form a deposited film having uniform and better physical characteristics over the whole film surface.

In the present invention, so that the deposited film forming process may proceed smoothly to form a film of high quality and having desired physical characteristics, as the film forming factors, the kinds and combination of the starting material and the halogenic oxidizing agent, mixing ratio of these, pressure during mixing, flow rate, the inner pressure in the film forming space, the flow types of the gases, the film forming temperature (substrate temperature and atmosphere temperature) are suitably selected as desired. These film forming factors are organically related to each other, and they are not determined individually but determined respectively under mutual relationships. In the present invention, the ratio of the gaseous starting material for formation of a deposited film and the gaseous halogenic oxidizing agent introduced into the reaction space may be determined suitably as desired in relationship of the film-forming factors related among the fill forming factors as mentioned above, but it is preferably $1/20$ to $100/1$, more preferably $1/5$ to $50/1$ in terms of flow rate ratio introduced.

The pressure during mixing when introduced into the reaction space may be preferably higher in order to enhance the chemical contact between the above gaseous starting material and the above gaseous halogenic oxidizing agent in probability, but it is better to determine the optimum value suitably as desired in view of the reactivity. Although the pressure during mixing may be determined as described above, each of the pressure during introduction may be preferably $1 \times 10^{-7}$ atm to 10 atm, more preferably $1 \times 10^{-6}$ atm to 3 atm.

On the other hand, when two or more kinds of gaseous starting materials are introduced and permitted to react by contact with the gaseous halogenic oxidizing agent respectively to prepare precursors, since the respective gaseous starting materials differ in reactivity with the gaseous halogenic oxidizing agent, if the two or more kinds of gaseous starting materials are introduced under the mixed state and contacted and reacted with the gaseous halogenic oxidizing agent, desired precursors cannot be prepared independently. For example, when $SiH_4$ gas and $GeH_4$ gas are introduced in predetermined amounts for the purpose of forming an a-SiGe film and they are allowed to react with $F_2$ gas, since the reactivity of $GeH_4$ with $F_2$ is greater than that of $SiH_4$ with $F_2$, the process to extract H from $GeH_4$ will proceed more repidly than that to extract H from $SiH_4$, and therefore the deposited film is liable to become a film with relatively poor characteristic having much unbonded arms caused by Ge.

Accordingly, in the present invention, there is employed the system in which individual gaseous starting materials are mixed separately with the halogenic oxidizing agent to prepare precursors and the individual precursors are introduced into the film forming space.

In the present invention, during formation of a multi-layer structure deposited film, the layer constitution of the multi-layer structure film is controlled according to the method as described below.

Here, description is made by referring to an example in which a layer with a constitution I is formed with the starting materials (A) and (B), a layer with constitution II is formed only with the starting material (A), and the layer with the constitution I and the layer with the constitution II are laminated successively alternately to form a multi-layer structure film.

During film formation of the layer with the constitution I, starting materials (A) and (B) are individually contacted chemically with the halogenic oxidizing agent to form precursous (a) and (b), which are led onto the substrate to form the layer with the constitution I.

In forming the layer with the constitution II, two systems may be exemplified. A first system impedes introduction of the starting material (B) into the reaction space with an electromagnetic valve. In the present invention, since the pressure in the film forming space has no effect on the film forming conditions as different from the case of the plasma CVD method, this system can be effective. Particulary, if the starting material (B) is permitted to flow immediately before the film forming space, film composition can be controlled considerably abruptly. A second system impedes reaching of the precursor (b) to the substrate. Also in this case, in the present invention, as differnt from the plasma CVD method, no electrical field is applied in the film forming space, film forming conditions are not affected by placement of a metallic or non-metallic shielding plate in the film forming space.

The pressure within the film forming space, namely the pressure in the space in which the substrate for film formation on its surface is arranged may be set suitably as desired so that the precursors (E) under excited state generated in the reaction space and sometimes the precursors (D) formed as secondary products from said precursors (E) may contribute effectively to film formation.

The inner pressure in the film forming space, when the film forming space is continuous openly to the reaction space, can be controlled in relationship with the introduction pressures and flow retes of the gaseous starting material for formation of a deposited film and a gaseous halogenic oxidizing agent in the reaction space, for example, by application of a contrivance such as differencial evacuation or use of a large scale evacuating device.

Alernatively, when the conductance at the connecting portion between the reaction space and the film forming space is small, the pressure in the film forming space can be controlled by providing an appropriate evacuating device in the film forming space and controlling the evacuation amount of said device.

On the other hand, when the reaction space and the film forming space is integrally made and the reaction position and the film forming position are only different in space, it is possible to effect differential evacuation or provide a large scale evacuating device having sufficient evacuating capacity as described above.

As described above, the pressure in the film forming space may be determined in the relationship with the introduction pressures of the gaseous starting material and the gaseous halogenic oxidizing agent introduced into the reaction space, but it is preferably 100 Torr or lower, more preferably 30 Torr or lower, 10 Torr or lower.

As for the flow type of the gases, it is necessary to design the flow type in view of the geometric arrangement of the gas introducing inlet, the substrate and the gas evacuating outlet so that the starting material for formation of a deposited film and the halogenic oxidizing agent may be efficiently mixed during introduction of these into the reaction space, the above precursors (E) may be efficiently generated and film formation may be adequately done without trouble. A preferable example of the geometric arrangement is shown in FIG. 1.

As to the substrate temperature (Ts) during film formation, it can be set suitably as desired individually depending on the gas species employed and the kinds and the required characteristics of the deposited film formed, but, in the case of obtaining an amorphous film, it is preferably from room temperature to 450° C., more preferably from 50° to 400° C. Particularly, in the case of forming a silicon deposited film with better semi-conductor characteristics and photoconductive characteristics, etc., the substrate temperature (Ts) should desirably be made 70° to 350° C. On the other hand, in the case of obtaining a polycrystalline film, it should preferably be 200° to 650° C., more preferably 300° to 600° C.

As to the atmosphere temperature (Tat) in the film forming space, it may be determined suitably as desired in relationship with the substrate temperature (Ts) so that the above precursors (E) generated and the above precursors (D) are not changed to unsuitable chemical species for film formation, and also the above precursors (E) may be efficiently generated.

The substrate to be used in the present invention may be either electroconductive or electrically insulating, provided that it is selected as desired depending on the use of the deposited film formed. As the electroconductive substrate, there may be mentioned metals such as NiCr, stainless steel, Al, Cr, Mo, Au, Ir, Nb, Ta, V, Ti, Pt, Pd, etc., or alloys thereof.

As insulating substrated, there may be conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics and so on. At least one side surface of these substrates is preferably subjected to treatment for imparting electroconductivity, and it is desirable to provide other layers on the side at which said electro conductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3 + SnO_2$) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc., or by laminating treatment with said metal, thereby imparting electroconductivity to the surface. The substrate may be shaped in any form such as cylinders, belts, plates or others, and its form may be determined as desired.

The substrate should be preferably selected from among those set forth above in view of adhesion and reactivity between the substrate and the film. Further, if the difference in thermal expansion property between both is great, a large amount of strains may be created within the film to give sometimes no film of good quality, and therefore it is preferable to use a substrate so that the difference in thermal expansion property between both is small.

Also, the surface state of the substrate is directly related to the structure of the film (orientation) or generation of or a stylet structures, and therefore it is desirable to treat the surface of the substrate to give a film structure and a film texture so that desired characteristics may be obtained.

The present invention is described below by referring to Examples of the invention.

EXAMPLE 1

FIG. 1 shows schematically an example of the apparatus for forming a deposited film of the present invention.

The deposited film forming apparatus shown in FIG. 1 is broadly classified into a main device (vacuum chamber), an evacuation system and a gas feeding system.

In the main device, a reaction space and a film forming space are provided.

101–108 are respectively bombs filled with the gases to be used during film formation, 101a–108a are respectively gas feeding pipes, 101b–108b are respectively mass flow controllers for controlling the flow rates of the gases from the respective bombs, 101c–108c are respectively gas pressure gauges, 101d–108d and 101e–108e are respectively valves, and 101f–108f are respectively pressure gauges indicating the pressures in the corresponding gas bombs.

120 is a vaccum chamber equipped at the upper portion with two blowing pipes 111, 112 for gas introduction, having a structure for formation of the reaction space downstream of said blowing pipes, and also having a structure for formation of a film forming space in which a substrate holder 122 is provided so that a substrate 118 may be provided as opposed to the gas discharging outlet of the pipeline. The gas blowing pipes 111, 112 for gas introduction each has a concentric double-tubular structure. The blowing pipe 111 comprises from the innerside a first gas introducing pipe 109 for introducing the gases from the gas bombs 101–103 and a second gas introducing pipe 110 for introducing the gas from the gas bomb 104. The blowing pipe 112 comprises from the innerside a first gas introducing pipe 123 for introducing the gases from the gas bombs 105, 106 and a second gas introducing pipe 124 for introducing gases from the gas bombs 107, 108.

In each gas blowing pipe, the gas discharging outlet of each gas introducing pipe is designed so as to be positioned farther from the surface of the substrate as the gas introducing pipe is nearer to the innerside. In other words, the gas introducing pipes are arranged so that the pipe on the outer side may enclose the pipe exisiting within the innerside thereof.

The gases from the respective bombs are fed into the respective introducing pipes through the gas feeding pipelines 125–128, respectively. The respective gas introducing pipes, the respective gas feeding pipe lines and the vacuum chamber 120 are evacuated to vacuum through the main vacuum valve 119 by means of a vacuum evacuating device not shown.

The substrate 118 is set at a suitable desired distance from the positions of the respective gas introducing pipes by moving vertically the substrate holder 122.

In the present invention, the distance between the substrate 118 and the gas discharging outlet of the gas introducing pipe may be determined appropriately in view of the kinds and the desired characteristics of the deposited film formed, the gas flow rates, the inner pressure in the vacuum chamber 120, etc., but it is preferably several mm to 20 cm, more preferably about 5 mm to about 15 cm.

113 is a heater for heating the substrate 118 which is provided in order to heat the substrate to an appropriate temperature during film formation, or preheating the substrate 118 before film formation, or further to anneal the film after film formation.

The substrate heating heater 113 is supplied with power through a conductive wire 114 from a power source 115.

116 is a thermocouple for measuring the temperature of the substrate (Ts) and is electrically connected to the temperature display device 117.

129 is a circular shielding plate which is positioned below one of the blowing pipes 112. 130 is a motor for rotational driving of the shielding plate 129. The shielding plate 129 is opened with a long arc-shaped hole over the half of the whole circumference on the circumference corresponding to the gas discharging outlet at the tip end of the gas introducing pipe 124. Accordingly, by rotating the shielding plate 129, the precursors from the blowing pipe 112 can or cannot reach the substrate 118. Thus, by changing the rotational speed of the shielding plate 129, the thickness of each layer in the multi-layer structure film to be formed can be controlled.

By use of the film forming device shown in FIG. 1, a multi-layer structure deposited film was prepared as described below.

The $SiH_4$ gas filled in the bomb 101 was introduced at a flow rate of 20 sccm through the gas introducing pipe 109, and the $F_2$ gas diluted with He gas to 10% filled in the bomb 104 at a flow rate of 200 sccm through the gas introducing pipe 110, respectively, into the gas blowing pipe 111. In the mixing region of $SiH_4$ gas and $F_2$ gas, blueish white luminescence was strongly observed.

Next, the $GeH_4$ gas filled in the bomb 105 was introduced at a flow rate of 5 sccm through the gas introducing pipe 123, and the $F_2$ gas diluted with He gas to 10% filled in the bomb 107 at a flow rate of 20 sccm through the gas introducing pipe 124, respectively, into the gas blowing pipe 112. In the mixing region of $GeH_4$ gas and $F_2$ gas, luminescence was similarly observed.

The pressure in the vacuum chamber 120 was 200 mTorr. A quartz glass (15 cm×15 cm) was used for the substrate, and the distance between the gas discharging outlet at the lower end of the gas introducing pipes 110, 124 and the substrate 118 was made 5 cm. The substrate temperature (Ts) was set at from room temperature to 200° C.

When the above starting materials and the halogenic oxidizing agent were permitted to flow for 10 min. under rotation of the shielding plate 129 at 5 rpm by the motor 130, a multi-layer structure film with a film thickness of 0.5 μm comprising an a-SiGe:H(F) layer with a thickness of 60 Å and an a-Si:H(F) layer with a thickness of 50 Å laminated alternately was formed.

The film thus obtained was confirmed to be amorphous by electron beam diffraction.

On the multi-layer structure film, a comb-shaped electrode (gap length 200 μm) of aluminum was vapor deposited to prepare a sample for measurement of electroconductivity. Each sample was placed in a vacuum cryostat, a voltage of 100 V was applied and the current was measured by a minute amperemeter (YHP4140B) to determine the dark electroconductivyty (σd). As a result, it was found to be $2 \times 10^{-10}$ S/cm. Also, light of 750 nm and 0.3 mw/cm² was irradiated to determine the photoconductivity (σp). As a result, it was found to be $5 \times 10^{-6}$ S/cm.

EXAMPLE 2

By use of the apparatus shown in FIG. 1, a PIN diode device of a PIN structure with the I layer having a multi-layer structure of a-Si and a-SiGe was prepared on a glass substrate.

A glass substrate attached with an ITO film to a thickness of about 1000 Å according to the sputtering method was set on a holder 122 in the vacuum chamber 120. The $SiH_4$ gas containing 3000 ppm of $B_2H_6$ gas filled in the bomb 102 was introduced at a flow rate of 20 sccm through the gas introducing pipe 109, and at the same time the $F_2$ gas diluted with He gas to 10% filled in the bomb 104 at a flow rate of 200 sccm through the gas introducing pipe 110, respectively, into the gas belowing pipe 111 to carry out the reaction. By this operation, a p-type a-Si:H film doped with B was formed to a thickness of 200 Å on the ITO film. Subsequently, according to the same procedure as in Example 1, a multi-layer structure film with a film thickness of 5000 Å having an a-SiGe:H(F) and an a-Si:H(F) laminated alternately was formed. Subsequently, the $SiH_4$ gas containing 3000 ppm of $PH_3$ gas filled in the bomb 103 was introduced at a flow rate of 20 sccm through the gas introducing pipe 109, and at the same time the $F_2$ gas diluted with He gas to 10% filled in the bomb 104 at a flow rate of 200 sccm through the gas introducing pipe 110, respectively, into the blowing pipe 111 to carry out the reaction. By this operation, a n-type a-Si:H film doped with P was deposited to a thickness of 200 Å on the above multi-layer structure film.

Then, the substrate was taken out from the vacuum chamber and an aluminum electrode was formed by deposition to 500 Å thickness on the above n-type a-Si:H film according to the vacuum vapor deposition method by heating of resistance.

To the PIN diode thus obtained were connected a power source and an amperemeter, and solar battery characteristics were determined by irradiation of light of AM-1 and 100 mW/cm². As a result, the values of Voc=0.8 V, Jsc=mA/cm², FF=0.7 and conversion efficiency=8.4% were obtained.

EXAMPLE 3

By use of the apparatus shown in FIG. 1, an electrophotographic photosensitive member was prepared according to the following procedure.

First, according to the same procedure as in Example 2, a p-type a-Si:H film doped with B was deposited to 3 μm thickness on the aluminum substrate.

Next, according to the same procedure as in Example 1, a multi-layer structure film with a film thickness of 17 μm having an a-SiGe:H(F) layer and an a-Si:H(F) layer laminated alternately with a period of 110 Å was formed.

Subsequently, the SiH$_4$ gas filled in the bomb 101 was introduced at a flow rate of 20 sccm through the gas introducing pipe 109, and at the same time the F$_2$ gas diluted with He gas to 10% filled in the bomb 104 at a flow rate of 200 sccm through the gas introducing pipe 110, respectively, into the gas blowing pipe 111 to carry out the reaction. At the same time, the CH$_4$ gas filled in the bomb 106 is introduced at a flow rate of 10 sccm through the gas introducing pipe 123 and the F$_2$ gas diluted with He to 10% filled in the bomb 107 at a flow rate of 100 sccm through the gas introducing pipe 124, respectively, into the blowing pipe 112 to carry out the reaction. During this operation, the shielding plate 129 was rotated at a speed of 5 rpm. By this operation, a mauti-layer structure film with a thickness of 5000 Å having a-SiC layer and a-Si layer laminated alternately was deposited.

When the thus obtained electrophotographic photosensitive member was subjected to ⊕ corona discharging for 0.2 seconds, an acceptance potential of +380 V was obtained. When light of 750 nm and 0.3 mW/cm$^2$ was irradiated for 0.2 seconds, the potential became 0 V.

EXAMPLE 4

By use of the apparatus shown in FIG. 1, an optical diode having a PIN structure was prepared according to the following procedure.

First, a glass substrate attached with an ITO film to a thickness of about 1000 Å thereon was set on a holder 122 in the vacuum chamber 120. The SiH$_4$ gas containing 3000 ppm of B$_2$H$_6$ gas filled in the bomb 102 was introduced at a flow rate of 20 sccm through the gas introducing pipe 109, and the F$_2$ gas diluted with He gas to 10% filled in the bomb 104 at a flow rate of 200 sccm through the gas introducing pipe 110, respectively, into the gas blowing pipe 111 to carry out the reaction, and the precursors containing Si atoms were blown out from the blowing pipe 111. At the same time, the CH$_4$ gas filled in the bomb 106 was introduced at a flow rate of 10 sccm through the gas introducing pipe 123, and the F$_2$ gas diluted with He gas to 10% filled in the bomb 107 at a flow rate of 100 sccm through the gas introducing pipe 124, respectively, into the blowing pipe 112 to carry out the reaction, and the precursous containing C atoms were blown out from the blowing pipe 112. During this operation, the shielding plate 129 was rotated at a speed of 5 rpm. By this operation, a multi-layer structure film with a thickness of 200 Å having an a-SiC layer with a thickness of 50 Å and an a-Si layer with a thickness of 50 Å laminated alternately was deposited.

Next, according to the same procedure as in Example 1, a multi-layer structure film with a thickness of 5000 Å having an a-SiGe layer and an a-Si layer laminated alternately was formed.

Subsequently, the SiH$_4$ gas containing 3000 ppm of PH$_3$ gas filled in the bomb 103 was introduced at a flow rate of 20 sccm through the gas introducing pipe 109, and at the same time the F$_2$ gas diluted with He gas to 10% filled in the bomb 104 at a flow rate of 200 sccm through the gas introducing pipe 110, respectively, into the blowing pipe 111 to carry out the reaction. By this operation, a n-type a-Si:H film doped with P was deposited to a thickness of 200 Å on the above multi-layer structure film.

Then, the substrate was taken out from the vaccum chamber and an aluminum electrode was formed by deposition to 500 Å thickness on the above n-type a-Si:H film according to the vaccum vapor deposition method by heating of resistance.

To the PIN diode thus obtained were connected a power source and an amperemeter, and solar battery characteristic were determined by irradiation of light of AM–1 and 100 mW/cm$^2$. As a result, the values of Voc=0.9 V, Jsc=16 mA/cm$^2$, FF=0.7 and conversion efficiency=10.1% were obtained.

EXAMPLE 5

Figure 2:
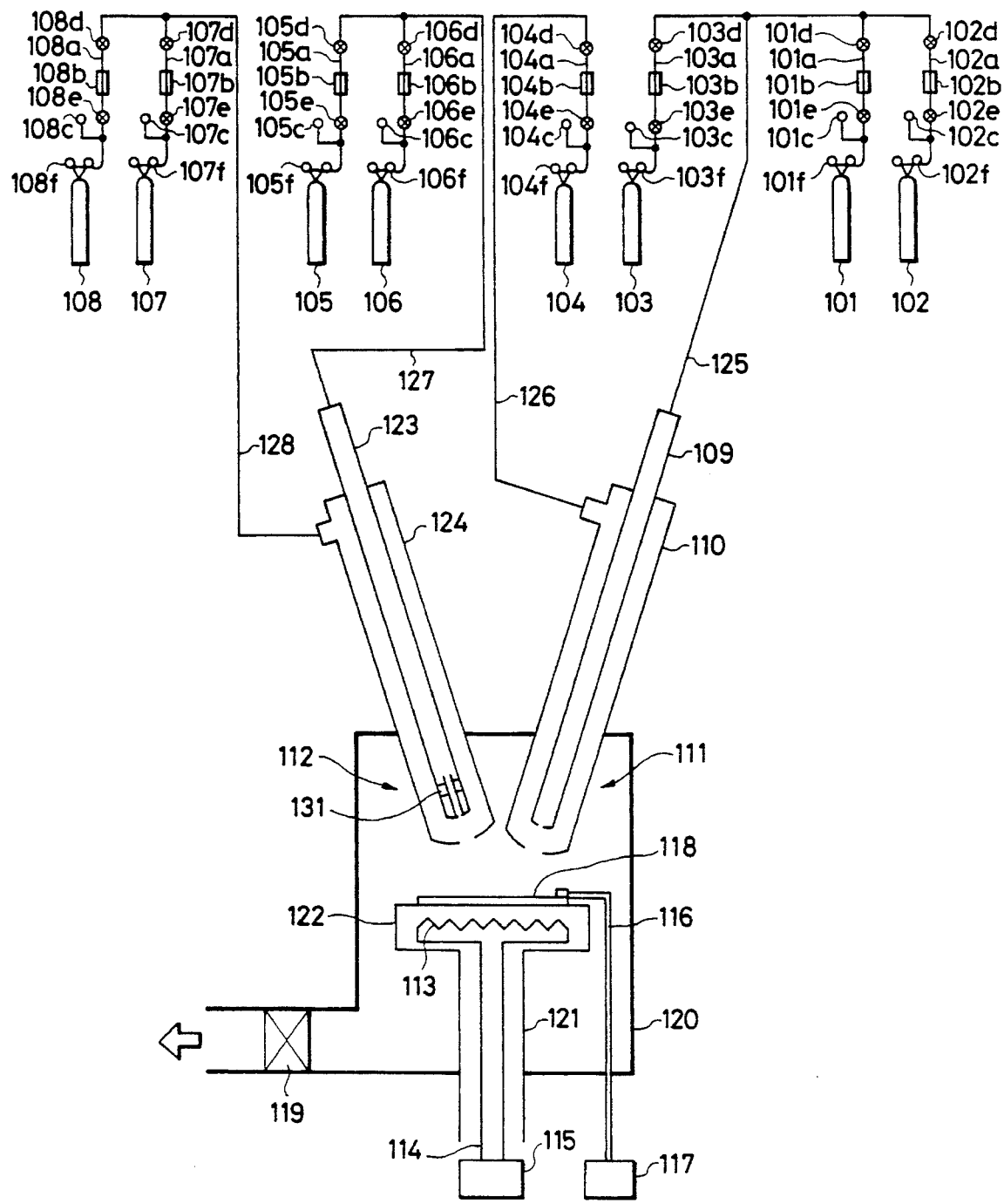

FIG. 2 illustrates another example of the apparatus for forming deposited film according to the present invention.

This apparatus is the same as the apparatus shown in FIG. 1 except that the shielding plate 129 and the motor 130 are excluded and an electromagnetic gas stopping valve 131 for controlling the gas flow within the gas introducing pipe 123 is provided in said pipe.

By use of the device shown in FIG. 2, a deposited film of a multi-layer structure was formed as described below.

The SiH$_4$ gas filled in the bomb 101 was introduced at a flow rate of 20 sccm through the gas introducing pipe 109, and the F$_2$ gas diluted with He gas to 10% filled in the bomb 104 at a flow rate of 200 sccm through the gas introducing pipe 110, respectively, into the gas blowing pipe 111. In the mixing region of SiH$_4$ gas and F$_2$ gas, blueish white luminescence was strongly observed.

Next, the GeH$_4$ gas filled in the bomb 105 was introduced at a flow rate of 5 sccm through the gas introducing pipe 123, and the F$_2$ gas diluted with He gas to 10% filled in the bomb 107 at a low rate of 20 sccm through the gas introducing pipe 124, respectively, into the gas blowing pipe 112. In the mixing region of GeH$_4$ gas and F$_2$ gas, luminescence was similarly observed.

The pressure in the vacuum chamber 120 was 200 mTorr. A quartz glass (15 cm×15 cm) was used for the substrate, and the distance between the gas discharging outlets at the lower end of the gas introducing pipes 110, 124 and the substrate 118 was made 5 cm. The substrate temperature (Ts) was set at 200° C.

While the electromagnetic valve 131 was controlled so that on-off might occur 5 times per minute, the above starting materials and the halogenic oxidizing agent were permitted to flow, respectively, for 10 minutes, whereby a multi-layer structure film with a film thickness of 0.5 μm having an a-SiGe:H(F) film with a thickness of 60 Å and an a-Si:H(F) film with a thickness of 50 Å laminated alternately was formed.

The film thus obtained was confirmed to be amorphous by electron beam diffraction.

On the multi-layer structure film, a comb-shaped electrode (gap length 200 μm) of aluminum was vapor deposited to prepare a sample for measurement of electroconductivity. Each sample was placed in a vaccum cryostat, a voltage of 100 V was applied and the current was measured by a minute amperemeter (YHP4140B) to determine the dark electroconductivity (σd). As a result, it was found to be 1×10$^{-10}$ S/cm. Also, light of 750 nm and 0.3 mw/cm$^2$ was irradiated to determine the photoconductivity (σp). As a result, it was found to be 1×10$^{-6}$ S/cm.

EXAMPLE 6

Figure 3A:
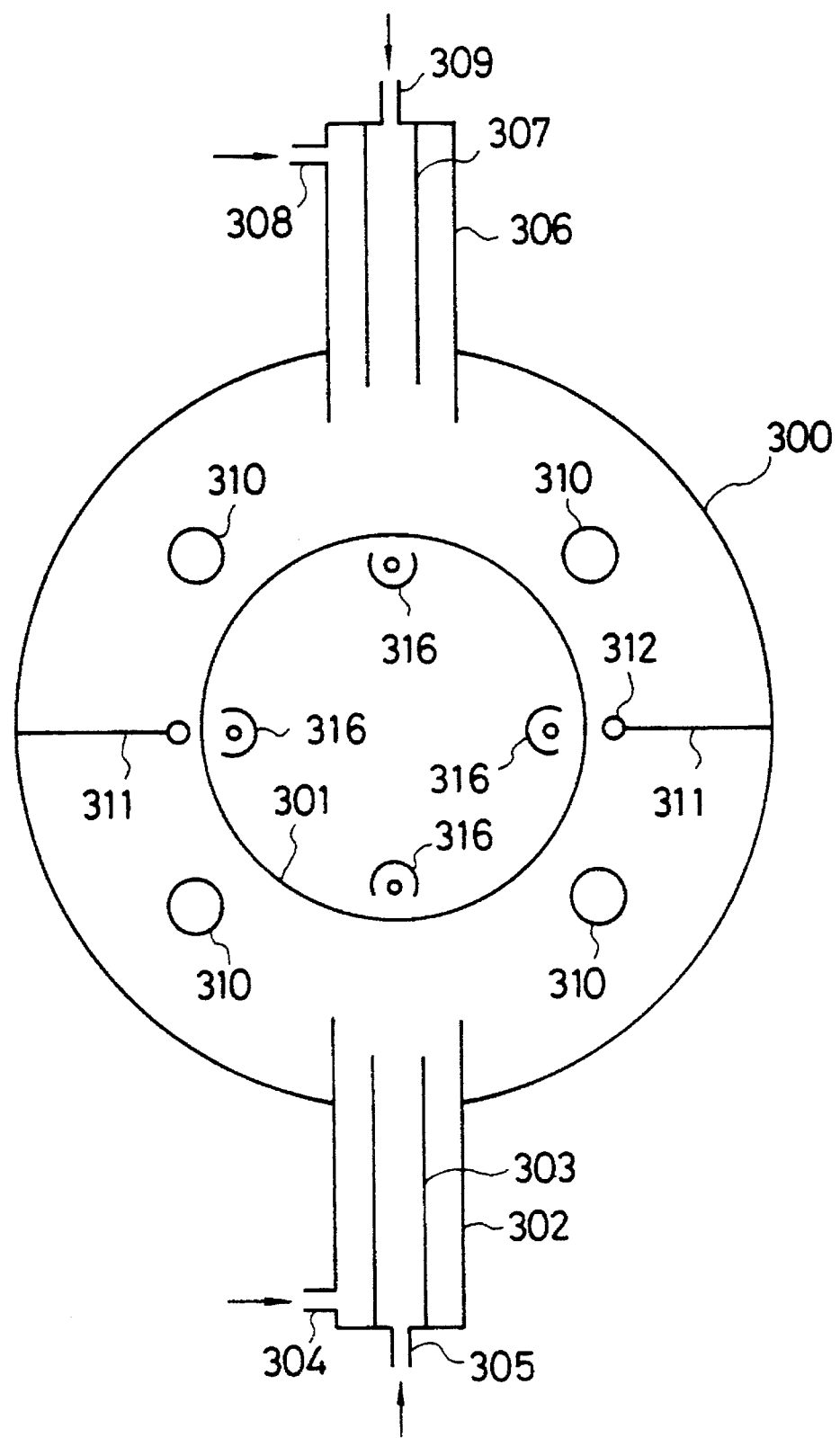
FIG. 3A and FIG. 3B are schematic lateral sectional and longitudinal views, respectively, of the apparatus for forming a deposited film of the third embodiment of the present invention.
Figure 3B:
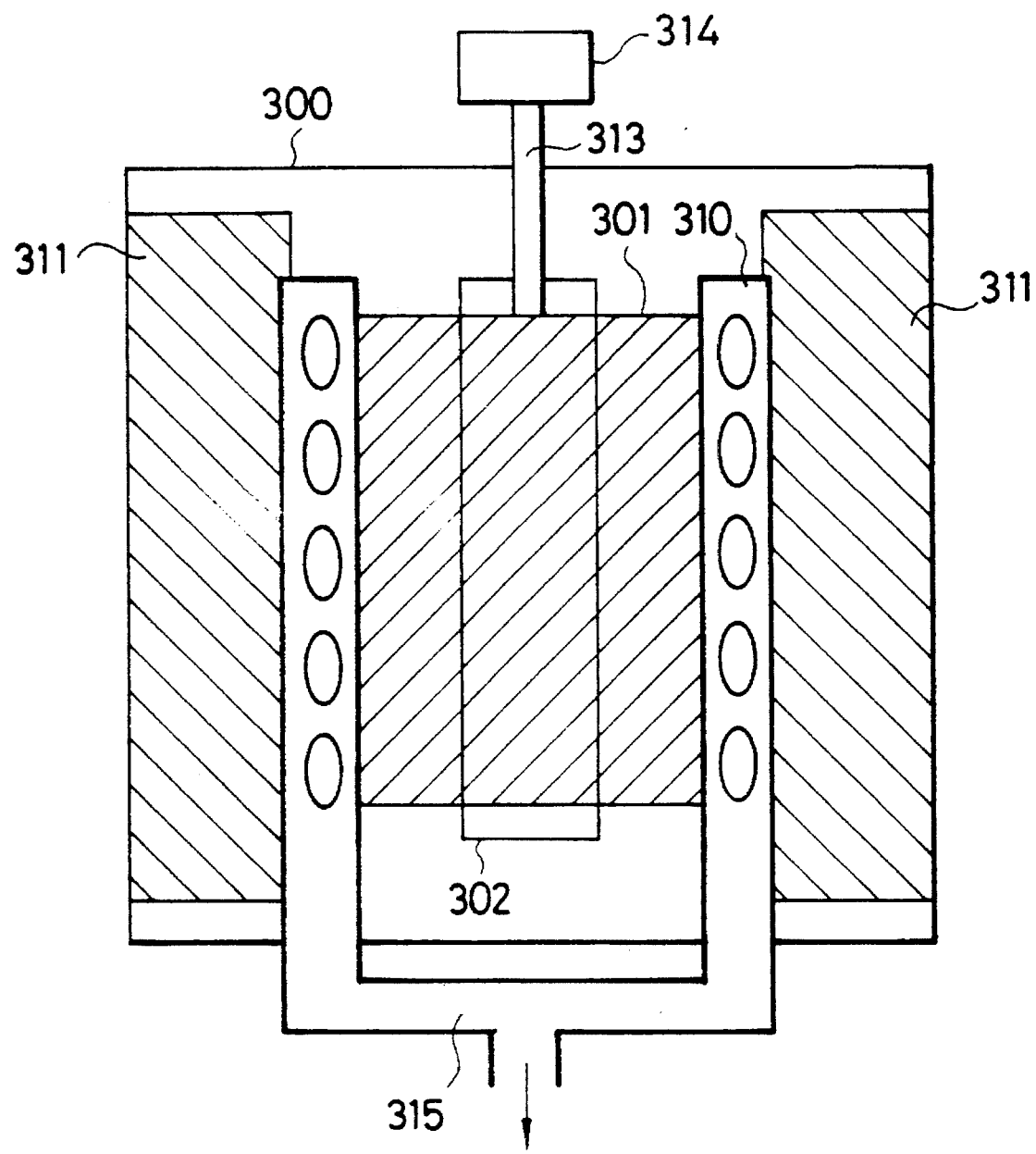

FIG. 3A is a schematic lateral sectional view showing still another example of the apparatus for forming a deposited film of the present invention, and FIG. 3B is a schematic longitudinal sectional view of the apparatus.

The apparatus shown in FIG. 3A and FIG. 3B is connected to an evacuation system and gas feeding system not shown.

The main apparatus is provided with two reaction spaces and a film forming space by utilizing the spaces common to each other.

300 is a film forming chamber, which is internally evacuated to vaccum through four evacuation pipes 310 by means of a turbomolecular pump.

301 is a cylindrical substrate and, if desired, a drum-shaped substrate of SUS or Al or a thin film of SUS or Al wound around a drum-shaped substrate may be used.

302 is an outside pipe of the gas introducing means of a double-tubular pipe structure and a halogenic oxidizing agent is introduced thereinto through the gas introducing inlet 304.

303 is an inside pipe which is concentric with the pipe 302.

Through the gas introducing inlet 305, a gaseous starting material is introduced into the inside reaction pipe.

The halogenic oxidizing agent introduced through the introducing inlet 304 into the outside reaction pipe 302 and the gaseous starting material introduced through the introducing inlet 305 into the inside reaction pipe 303 are mixed around the exit of the reaction pipe to form precursors. The precursors formed are collided against the substrate to effect film formation on the substrate.

306 is also the outside reaction pipe of the gas introducing means, of a double-tubular structure, and 307 is the inside reaction pipe.

The halogenic oxidizing agent and the starting gas with a composition different from that as described above are respectively introduced into the reaction pipe through the introducing pipes 308 and 309 and mixed around the exit of the reaction pipe to form precursors. The compositions of the precursors formed include those different from the precursors as mentioned above, and therefore the composition of the film formed on the substrate is different from that as described above. During this operation, by rotating the substrate 301, two films with different compositions can be formed in multiple layers. In order that a specific layer, for example, layer A may be first formed and then successively layer A/layer B/layer A/layer B . . . may be formed on the circumference of the drum, it is required that the gas for layer B should be controlled so as to be blown out after the drum has rotated half of the circumference after blow-out of the gas for layer A, and also feeding of the gas for layer B controlled so as to be stopped after half rotation after blow-out of the gas for layer A, or alternatively that the blow-out of the precursors onto the substrate should be controlled with shutters provided in front of the blowing pipes.

310, represents four gas discharging pipes which are provided at the positions so that the gases blown out from the two gas blowing outlets may be discharged before mixing through mutual diffusion, merged into one stream by a gas discharging pipe 315 and discharged through a vacuum evacuation device (not shown).

311 is a shielding plate for gases which prevents mixing of the two starting material gases. 312 is a blowing pipe of Ar gas, which prevents mixing of the two starting material gases by blowing Ar gas against the substrate.

The gas shielding plate 311 and the Ar blowing pipe 312 are provided in the apparatus of this Example for preventing completely mixing of the two starting material gases, but they are not necessarily required, if the positions of the gas discharging pipes 310 are selected at the optimum positions in view of the flow of gas. However, only for convenience in designing of the apparatus, they should preferably be provided.

The substrate 301 is rotated in the circumferencial direction by a shaft 313 and a motor 314 connected thereto. Inside of the substrate 301, four IR-lamps 316 are provided to heat the substrate 301 to a desired temperature.

By means of the film forming apparatus shown in FIGS. 3A and 3B, a multi-layer structure deposited film was prepared as described below.

After evacuating thoroughly internally the film forming chamber 300 by a vacuum evacuation device, the substrate 301 was rotated at a speed of 2 rpm and heated by IR-ray lamps 316 to 200° C. Then, under the state where Ar was blown at a flow rate of 2SLM from the Ar releasing pipe 312, $SiH_4$ gas was introduced at a flow rate of 40 sccm through the gas introducing pipe 305 into the reaction pipe 303. At the same time, $F_2$ gas diluted with He gas to 10% was introduced at a flow rate of 400 sccm through the gas introducing pipe 304 into the reaction pipe 302. Around the outlet of the reaction pipe 302, $SiH_4$ and $F_2$ were mixed together and blue luminecence was observed.

Next, under the state where the drum rotated half, through the gas introducing inlet 309, $SiH_4$ gas was introduced at 34 sccm and $GeH_4$ gas at 6 sccm into the reaction pipe 307, simultaneously with introduction of $F_2$ gas diluted with He gas to 10% at a flow rate of 400 sccm through the gas introducing pipe 308 into the reaction pipe 306. At around the outlet of the reaction pipe 306, $SiH_4$, $GeH_4$ and $F_2$ were mixed together and blue luminescence was observed.

After film formation under this state for 20 minutes, the feeding of the gases introduced through the gas introducing inlets 304 and 305 was stopped. Then after the drum rotated half, feeding of gases through the gas introducing inlets 308, 309 was stopped.

Then, feeding of Ar gas was stopped, the substrate was cooled to room temperature and thereafter the sample was taken out. As a result, a film comprpsing 80 layers of Si:H:F layer and SiGe:H:F layer each of about 50 Å thickness laminated alternately was formed to a thickness of about 4000 Å. The multi-layer structure film formed was confirmed to be amorphous by electron beam diffraction.

On the other hand, on the multi-layer structure film of the sample, a comb-shaped electrode (gap length 200 µm) of aluminum was vapor deposited to prepare a sample for measurement of electroconductivity. Each sample was placed in a vacuum cryostat, a voltage of 100 V was applied and the current was measured by a minute amperemeter (YHP4140B) to determine the dark electroconductivity (σd). As a result, it was found to be $3\times10^{-12}$ S/cm. Also, light of 750 nm and 0.3 mw/cm² was irradiated to determine the photoconductivity (σp). As a result, it was found to be $3\times10^{-6}$ S/cm.

In the apparatus shown in FIG. 3A and FIG. 3B, the gas reaction pipes are arranged with a phase of 180° in the rotational direction of the substrate, but phases can be provided freely corresponding the number of the gas reaction pipes. For example, when three or more gas blowing outlets are to be provided, they can be provided with provision of $2\pi/X$ radian of phase (X is the number of gas blowing outlets), and provided with shielding plates correspondingly thereto. Also, for example, by arranging the respective gas blowing outlets at substantially the same position and phases can be provided with respect to the blowing time to form a deposited film with a multi-layer structure.

EXAMPLE 7

According to the process as described below, by use of the apparatus shown in FIGS. 3A and 3B, a PIN diode device having a PIN structure with the I layer being a multi-layer structure of a-Si:H:F layer and a-SiGe:H:F layer was prepared on a stainless steel substrate.

With a thin stainless steel plate of 100 μm thickness wound around an aluminum drum, the substrate was heated to 200° C. and the film forming chamber 300 was evacuated to vacuum. Then, under the rotation of the drum at 2 rpm, $SiH_4$ gas containing 3000 ppm of $B_2H_6$ was flowed at a flow rate of 20 sccm through the gas introducing pipe 305 and at the same time $F_2$ gas diluted with He to 10% at a flow rate of 200 sccm through the gas introducing inlet 304 to carry out the reaction in the reaction pipe 302 to form a p-type a-Si:H:F film doped with B to 200 Å on the stainless steel substrate. Then, following the same procedure as in Example 6, a multi-layer structure film of a-SiGe:H:F layer and a-Si:H:F layer was formed to a thickness of about 5000 Å.

Subsequently, from the gas introducing inlet 305, $SiH_4$ gas containing 3000 ppm $PH_3$ was flowed to the gas introducing inlet 304 at a flow rate of 20 sccm, and at the same time $F_2$ gas diluted with He to 10% at a flow rate of 200 sccm to carry out the reaction in the reaction pipe 302 to form a n-type a-Si:H:F film doped with P to 200 Å on the sbustrate. Then, the substrate was taken out and placed in a vacuum sputtering device to deposite fan ITO electrode to 1000 Å.

To the PIN diode having a multi-layer structure film of a-SiGe:H:F layer and a-Si:H:F layer thus obtained were connected a film source and an amperemeter, and solar battery characteristics were determined by irradiation of light of AM–1 and 100 mW/cm². As a result, the values of Voc=0.9 V, Jsc=14 mA/cm², FF=0.7 and conversion efficiency=8.8% which was improved with compared with the prior art were obtained.

EXAMPLE 8

According to the following procedure, an electrophotographic photosensitive member was prepared.

On an aluminum substrate drum, in the manner as described in Example 7, a p-type a-Si:H:F film doped with B was vapor deposited to 6000 Å, and then according to the method as described in Example 6, a multi-layer structure film consisting of a-SiGe:H:F and a-SiGe:H:F was formed to 20μ with a period of about 100 Å, followed by introduction of $CH_4$ gas at a flow rate of 10 sccm through the gas introducing inlet 309 into the reaction pipe 307. At the same time, $F_2$ gas diluted with He to 10% was flowed at a flow rate of 100 sccm through the gas introducing inlet 308 into the gas reaction pipe 306 to carry out the reaction in the gas reaction pipe 306, thereby forming precursors. At the same time, $SiH_4$ gas was flowed at a flow rate of 20 sccm into the gas reaction pipe 303 and $F_2$ gas diluted with He to 10% at 200 sccm into the gas reaction pipe 302 to carry out the reaction in the gas reaction pipe 302, thereby forming precursors. As a result, a multi-layer structure film consisting of a-SiC:H:F layer and a-Si:H:F layer with a thickness of 5000 Å was formed.

When the thus obtained electrophotographic photosensitive member was subjected to ⊕ corona discharging for 0.2 seconds, a acceptance potential of +390 V was obtained. When light of 750 nm and 0.3 mW/cm² was irradiated for 0.2 seconds, the potential became 0 V.

EXAMPLE 9

By use of the apparatus shown in FIGS. 3A and 3B an optical diode having a PIN structure was formed on a stainless steel substrate according to the procedure described below and the solar battery characteristics were measured. Similarly as in Example 7, a substrate with a thin stainless film wound around an aluminum drum was placed in the film forming chamber 300, which was then thoroughly subjected to vacuum evacuation. With the substrate temperature maintained at 200° C., the drum was rotated at 2 rpm. Through the gas introducing inlet 305, $SiH_4$ gas containing 3000 ppm of $B_2H_6$ was flowed at a flow rate of 20 sccm into the gas reaction pipe 303, simultaneously with introduction of $F_2$ gas diluted with He to 10% from the gas introducing inlet 304 at a flow rate of 200 sccm into the gas reaction pipe 302, and the both gases were mixed to carry out the reaction and the precursors formed were blown out from the reaction pipe 302. At the same time, $CH_4$ gas was introduced through the gas introducing inlet 309 at a flow rate of 10 sccm, $SiH_4$ gas at a flow rate of 20 sccm into the gas reaction pipe 307, simultaneously with introduction of $F_2$ gas diluted with He to 10% at a flow rate of 100 sccm into the gas reaction pipe 306. In the gas reaction pipe 306, both gases were mixed to carry out the reaction, and the precursors formed were blown out from the reaction pipe 306. As a result, a multi-layer structure film consisting of an a-SiC:H:F layer with a thickness of 50 Å and an a-Si:H:F layer with a thickness of 70 Å was formed to a film thickness of 240 Å.

On this film, according to the same method as in Example 6, a multi-layer structure film of a-SiGe:H:F layer and a-Si:H:F layer was formed to a film thickness of 5000 Å. Next, through the gas introducing inlet 305. $SiH_4$ gas containing 3000 ppm of $PH_3$ was flowed at a flow rate of 20 sccm into the gas reaction pipe 303 and at the same time $F_2$ gas diluted with He to 10% at a flow rate of 200 sccm into the reaction pipe 302, and both gases were allowed to react with each other by mixing in the gas reaction pipe 302 to form a n-type a-Si:H:F film doped with P on the above multi-layer structure film of a-Si:H:F layer and a-SiGe:H:F layer to a thickness of 200 Å. Then, the substrate was taken out of the chamber and an ITO film was vapor deposited according to the sputtering method to a thickness of 1000 Å.

When the solar battery characteristics under light irradiation of AM–1, 100 mW/cm² of the PIN diode comprising the i layer of the multi-layer structure film of a-SiGe:H:F layer and a-Si:H:F layer and the p layer of the multi-layer structure film of a-SiC:H:F layer and a-Si:H:F layer were determined, the values of Voc=0.95, Jsc=16 mA/cm² FF=0.6 and the higher value of conversion efficiency=9.9% than that produced according to the prior method were obtained.

As can be seen from the description and respective Examples as set forth above, by use of the apparatus for forming a deposited film of the present invention, deposited films having uniform physical properties over a large area can be obtained with easy management of film quality at the same time as achievement of energy saving. Also, it is possible to obtain easily films excellent in productivity, bulk productivity, having high quality with excellent physical properties such as electrical, optical and semiconductor properties, etc.

What is claimed is:

1. An apparatus for forming multilayer deposited films by introducing a gaseous starting material for formation of a deposited film and a gaseous halogenic oxidizing agent having the property of oxidation action for said starting material into a reaction space to effect chemical contact therebetween to thereby form a plural number of precursors including a precursor in an excited state, and forming a deposited film on a substrate existing in a film forming space spatially communicated with said reaction space with the use of at least one precursor of the precursors as the feeding source for the constituent element of the deposited film, said apparatus comprising rotatory driving means for rotating said substrate, at least a first gas releasing means connected to a means for supplying a mixture of at least a first gaseous starting material and a gaseous halogenic oxidizing agent, and at least a second gas releasing means connected to a means for supplying a mixture of a second gaseous starting material which is different from the first gaseous starting material and the gaseous halogenic oxidizing agent, wherein the first gas releasing means and the second gas releasing means are disposed at different positions in relation to the direction of rotation of the substrate in the reaction space.

2. The apparatus according to claim 1, wherein the substrate is cylindrical.

3. The apparatus according to claim 1, wherein the substrate has a thin film shape and is wound in a drum shape.

4. The apparatus according to claim 1, wherein the first and the second gas releasing means have shutters.

5. The apparatus according to claim 1, further comprising a shielding plate for preventing gases released from the first and the second gas releasing means from mixing.

6. The apparatus according to claim 5, wherein the shielding plate has a third gas releasing means for preventing gases from mixing.

7. The apparatus according to claim 6, wherein the third gas releasing means releases Ar gas.

8. The apparatus according to claim 1, wherein the first and the second gas releasing means are of a double-tubular structure.

* * * * *

UNITED STATES PATENT AND TRADEMARK OFFICE
CERTIFICATE OF CORRECTION

PATENT NO. : 5,470,389

DATED : November 28, 1995

INVENTOR(S): SHUNICHI ISHIHARA

It is certified that error appears in the above-identified patent and that said Letters Patent is hereby corrected as shown below:

On the title page: Item

[75] INVENTORS

"Junichi Hanna" should read --Jun-ichi Hanna--.

COLUMN 1

Line 34, "structrue" should read --structure--.
Line 66, "best" should read --best way--.

COLUMN 2

Line 8, "a" should read --the--.
Line 10, "pointed" should read --pointed out--.
Line 16, "give" should read --cause--.
Line 23, "on-off" should read --on-off of--.
Line 45, "give damages" should read --cause damages--.

COLUMN 3

Line 17, "on" should read --an--.

COLUMN 4

Line 64, "mere-" should read --mere--.

UNITED STATES PATENT AND TRADEMARK OFFICE
CERTIFICATE OF CORRECTION

PATENT NO. : 5,470,389

DATED : November 28, 1995

INVENTOR(S): SHUNICHI ISHIHARA

It is certified that error appears in the above-identified patent and that said Letters Patent is hereby corrected as shown below:

COLUMN 5

Line 5, "mixied" should read --mixed--.
    Line 8, "a" should be deleted and
    "prucursors" should read --precursors--.
    Line 9, "precursous" should read --precursors--.
    Line 19, "demensional" should read --dimensional--.
    Line 20, "exicited" should read --excited--.
    Line 49, "fill" should read --film- --.

COLUMN 6

Line 9, "repidly" should read --rapidly--.
    Line 11, "much" should read --many--.
    Line 33, "precursous" should read --precursors--.
    Line 41, "particulay", ," should read --Particularly,--.
    Line 46, "differnt" should read --different--.
    Line 61, "retes" should read --rates--.
    Line 64, "differencial" should read --differential--.

COLUMN 7

Line 16, "10 Torr" should read
    --and most preferably 10 Torr--.
    Line 55, "be" (2nd occurrence) should be deleted.
    Line 62, "electro" should read --electro- --.

UNITED STATES PATENT AND TRADEMARK OFFICE
CERTIFICATE OF CORRECTION

PATENT NO. : 5,470,389

DATED : November 28, 1995

INVENTOR(S): SHUNICHI ISHIHARA

It is certified that error appears in the above-identified patent and that said Letters Patent is hereby corrected as shown below:

COLUMN 8

Line 14, "give" should read --sometimes--.
    Line 15, "sometimes no" should read --give a-- and "good" should read --bad--.
    Line 19, "of or" should read --of--.
    Line 20, "a" should be deleted.
    Line 45, "vaccum" should read --vacuum--.

COLUMN 10

Line 14, "conductivyty" should read --conductivity--.
    Line 33, "belowing" should read --blowing--.

COLUMN 11

Line 18, "mauti-layer" should read --multi-layer--.
    Line 47, "precursous" should read --precursors--.

COLUMN 12

Line 1, "vaccum" should read --vacuum--.
    Line 57, "vaccum" should read --vacuum--.

COLUMN 13

Line 9, "vaccum" should read --vacuum--.
    Line 55, "310," should read --310--.

UNITED STATES PATENT AND TRADEMARK OFFICE
CERTIFICATE OF CORRECTION

PATENT NO. : 5,470,389

DATED : November 28, 1995

INVENTOR(S) : SHUNICHI ISHIHARA

It is certified that error appears in the above-identified patent and that said Letters Patent is hereby corrected as shown below:

COLUMN 14

Line 6, "circumferencial" should read --circumferential--.
Line 25, "luminecence" should read --luminescence--.
Line 41, "comprpsing" should read --comprising--.
Line 61, "corresponding" should read --corresponding to--.

COLUMN 15

Line 32, "sbustrate." should read --substrate.--.
Line 33, "deposite fan" should read --deposit an--.
Line 41, "improved with" should read --improved--.
Line 53, "a-SiGe:H:F" (2nd occurrence) should read --a-Si:H:F--.
Line 55, "$CH_4$gas" should read --$CH_4$ gas--

UNITED STATES PATENT AND TRADEMARK OFFICE
CERTIFICATE OF CORRECTION

PATENT NO. : 5,470,389

DATED : November 28, 1995

INVENTOR(S) : SHUNICHI ISHIHARA

It is certified that error appears in the above-identified patent and that said Letters Patent is hereby corrected as shown below:

COLUMN 16

Line 3, "a" should read --an--.

Signed and Sealed this

Ninth Day of December, 1997

Attest:

BRUCE LEHMAN

*Attesting Officer*   *Commissioner of Patents and Trademarks*